US012592687B2

(12) United States Patent
Lu et al.

(10) Patent No.: US 12,592,687 B2
(45) Date of Patent: Mar. 31, 2026

(54) PHASE INTERPOLATOR (PI) INCLUDING WEIGHTED SUMMING CIRCUIT AND RELATED METHODS

(71) Applicant: Microsoft Technology Licensing, LLC, Redmond, WA (US)

(72) Inventors: Ping Lu, Cary, NC (US); Minhan Chen, Cary, NC (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 30 days.

(21) Appl. No.: 18/514,165

(22) Filed: Nov. 20, 2023

(65) Prior Publication Data

US 2025/0167776 A1    May 22, 2025

(51) Int. Cl.
H03K 5/13 (2014.01)
H03K 17/56 (2006.01)

(52) U.S. Cl.
CPC .............. H03K 5/13 (2013.01); H03K 17/56 (2013.01)

(58) Field of Classification Search
CPC .................................. H03K 5/13; H03K 17/56
See application file for complete search history.

(56) References Cited

U.S. PATENT DOCUMENTS

| | | | |
|---|---|---|---|
| 6,380,774 B2 | 4/2002 | Saeki | |
| 2005/0024117 A1* | 2/2005 | Kubo | .................. H03K 17/693 |
| | | | 327/258 |
| 2010/0098203 A1 | 4/2010 | Chien | |
| 2011/0255643 A1 | 10/2011 | Fu | |

| | | | |
|---|---|---|---|
| 2020/0195240 A1* | 6/2020 | Lim | ...................... H03L 7/0814 |
| 2022/0224318 A1 | 7/2022 | Son | |
| 2023/0041998 A1 | 2/2023 | Chong | |
| 2023/0155595 A1 | 5/2023 | Huang | |
| 2023/0344419 A1* | 10/2023 | Chaturvedi | .............. H03K 5/13 |
| 2024/0121073 A1 | 4/2024 | Ye | |
| 2024/0348954 A1 | 10/2024 | Zhang | |
| 2025/0150253 A1 | 5/2025 | Lu | |

OTHER PUBLICATIONS

International Search Report and Written Opinion received for PCT Application No. PCT/US2024/051689, Feb. 10, 2025, 15 pages.
International Search Report and Written Opinion received for PCT Application No. PCT/US2024/052174, Feb. 18, 2025, 17 pages.
Notice of Allowance mailed on Mar. 21, 2025, in U.S. Appl. No. 18/386,980, 10 pages.

* cited by examiner

*Primary Examiner* — Daniel C Puentes
(74) *Attorney, Agent, or Firm* — Novo TechIP International PLLC

(57) ABSTRACT

To compensate for the non-linearity of a phase interpolation (PI) circuit, the interpolation clocks of two PI circuits receiving different interpolation codes may be summed. However, even if the non-linearities of the interpolated clocks have opposite polarities, they may have different magnitudes causing some non-linearity. A weighted summing PI that sums interpolated clocks of two PI circuits includes a weighted summing circuit that employs a weight signal to generate a weighted summed interpolated clock having an interpolated phase, based on the weight signal, between the phases of the interpolated clocks. As a result, the phase of the weighted summed interpolated clock may be more influenced by the phase of one of the interpolated clocks from the two PI circuits than the other. A weight calibration circuit may be included to select a balanced weight signal to reduce non-linearity in the weighted summing PI.

17 Claims, 9 Drawing Sheets

CLOCK_0°

CLOCK_90°

CLOCK_180°

CLOCK_270°

PI_OUT1

PI_OUT2

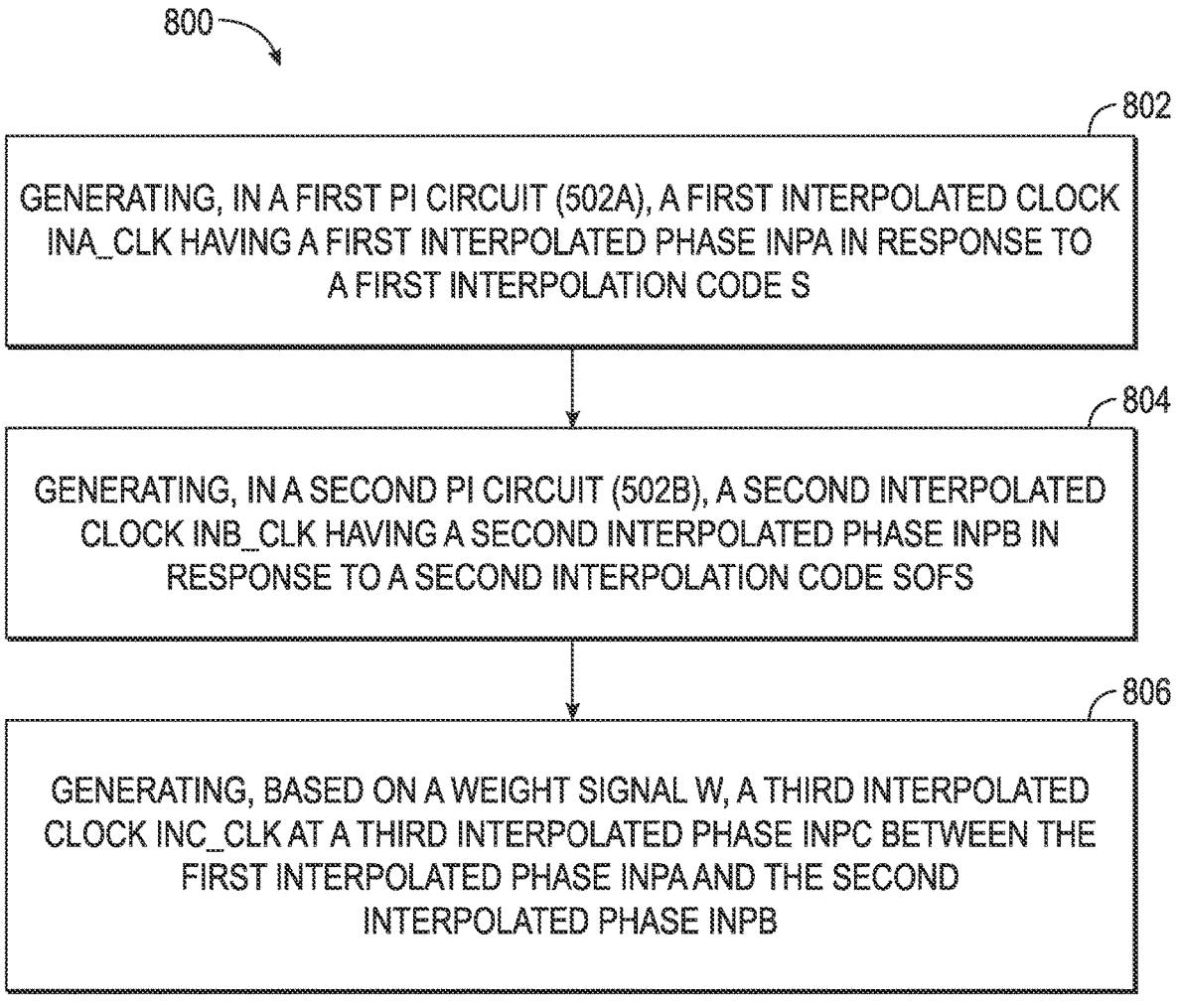

800

802

GENERATING, IN A FIRST PI CIRCUIT (502A), A FIRST INTERPOLATED CLOCK INA_CLK HAVING A FIRST INTERPOLATED PHASE INPA IN RESPONSE TO A FIRST INTERPOLATION CODE S

804

GENERATING, IN A SECOND PI CIRCUIT (502B), A SECOND INTERPOLATED CLOCK INB_CLK HAVING A SECOND INTERPOLATED PHASE INPB IN RESPONSE TO A SECOND INTERPOLATION CODE SOFS

806

GENERATING, BASED ON A WEIGHT SIGNAL W, A THIRD INTERPOLATED CLOCK INC_CLK AT A THIRD INTERPOLATED PHASE INPC BETWEEN THE FIRST INTERPOLATED PHASE INPA AND THE SECOND INTERPOLATED PHASE INPB

FIG. 8

PHASE INTERPOLATOR (PI) INCLUDING WEIGHTED SUMMING CIRCUIT AND RELATED METHODS

FIELD OF THE DISCLOSURE

The technology of the disclosure relates, in general, to phase interpolators (PIs) and, more particularly, to improving the linearity of phase interpolation.

BACKGROUND

In digital logic circuits, data may be transmitted from one sequential logic circuit (e.g., D Flip-Flop) to another through combinational logic in each cycle of a system clock signal. A receiving sequential logic circuit captures the data indicated by a voltage level on an input in the next clock cycle. If there is any variation in the period of the clock signal as a result of uncertainty (e.g., jitter), the signals may not have sufficient time to stabilize at the input of the next sequential logic circuit before the next clock signal. Thus, the clock used to capture the data needs to be synchronized to the data. The data stored in a sequential logic circuit may also be provided to circuits of other types but still require a clock signal that is synchronized to the data. In some cases, a clock signal is needed to capture data at an optimal time in each cycle. The optimal time can be at any phase of the system clock signal, not just at the rising edge that triggers the sequential logic circuit. To generate a clock signal at a target phase, a phase interpolator (PI) may be used. A PI generates an interpolated clock in a phase range between two reference clocks having different phases (e.g., 0 degree and 90 degree), preferably dividing the phase range into equal increments and generating the interpolated clock at a closest increment. In such case, the difference between the optimal phase location and the closest increment may be less than half the width of the increment. However, phase-interpolators implemented in transistor circuits suffer from non-linearity, such that the divisions between phase increments may not be equal to each other, with some being too narrow and some too wide. Efforts to improve the linearity of a PI are ongoing.

SUMMARY

Exemplary aspects disclosed herein include a phase interpolator (PI) with a weighted summing circuit. Related methods of adjusting a PI to a limited range of integral non-linearity are also disclosed. In response to a range of interpolation codes, a PI circuit can generate a clock signal having a phase at one of a plurality of phases increments in a phase range between two reference clocks. Due to transistor non-linearity, the phase increments of an interpolated clock from a PI circuit may not be uniform divisions of the phase range. To compensate for the non-linearity, a second PI circuit receives a second interpolation code in a range of interpolation codes that are offset from those of the first PI circuit and the interpolated clocks of each PI circuit are added to compensate for their respective non-linearities. However, even if the non-linearities of the interpolated clocks have opposite polarities, they may have different magnitudes, so the phase increments of a summed interpolated clock may also be non-uniform. In an exemplary aspect, a weighted summing PI that sums interpolated clocks of two PI circuits includes a weighted summing circuit that employs a weight signal to generate a weighted summed interpolated clock having an interpolated phase, based on the weight signal, between the phases of the interpolated clocks. As a result, the phase of the weighted summed interpolated clock may be more influenced by the phase of one of the interpolated clocks from the two PI circuits than the other. In some examples, a weight calibration circuit may be included to select a balanced weight signal to reduce non-linearity in the weighted summing PI.

In one exemplary aspect, a weighted summing phase interpolator is disclosed. The weighted summing PI includes a first PI circuit configured to generate a first interpolated clock having a first interpolated phase in response to a first interpolation code, a second PI circuit configured to generate a second interpolated clock having a second interpolated phase in response to a second interpolation code, and a weighted summing circuit configured to generate, based on a weight signal, a third interpolated clock having a third interpolated phase between the first interpolated phase and the second interpolated phase.

In another exemplary aspect, a method in a weighted summing PI circuit is disclosed. The method includes generating, in a first PI circuit, a first interpolated clock having a first interpolated phase in response to a first interpolation code, generating, in a second PI circuit, a second interpolated clock having a second interpolated phase in response to a second interpolation code, and generating, based on a weight signal, a third interpolated clock at a third interpolated phase between the first interpolated phase and the second interpolated phase.

In another exemplary aspect, an integrated circuit (IC) is disclosed. The IC includes a sequential logic circuit configured to store data in response to a system clock; a capture circuit configured to, in each cycle of the system clock, receive the data from the sequential logic circuit in response to a third interpolated clock; and a weighted summing PI. The weighted summing PI includes a first PI circuit configured to generate a first interpolated clock having a first interpolated phase in response to a first interpolation code and a second PI circuit configured to generate a second interpolated clock having a second interpolated phase in response to a second interpolation code. The weighted summing PI further includes a weighted summing circuit configured to generate, based on a weight signal, the third interpolated clock at a third interpolated phase between the first interpolated phase and the second interpolated phase.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIG. 8 is a flowchart illustrating a method of generating an interpolated clock in the weighted summing PI in FIG. 5 and optionally including the weight calibration circuit in FIG. 7;

Figure 7:
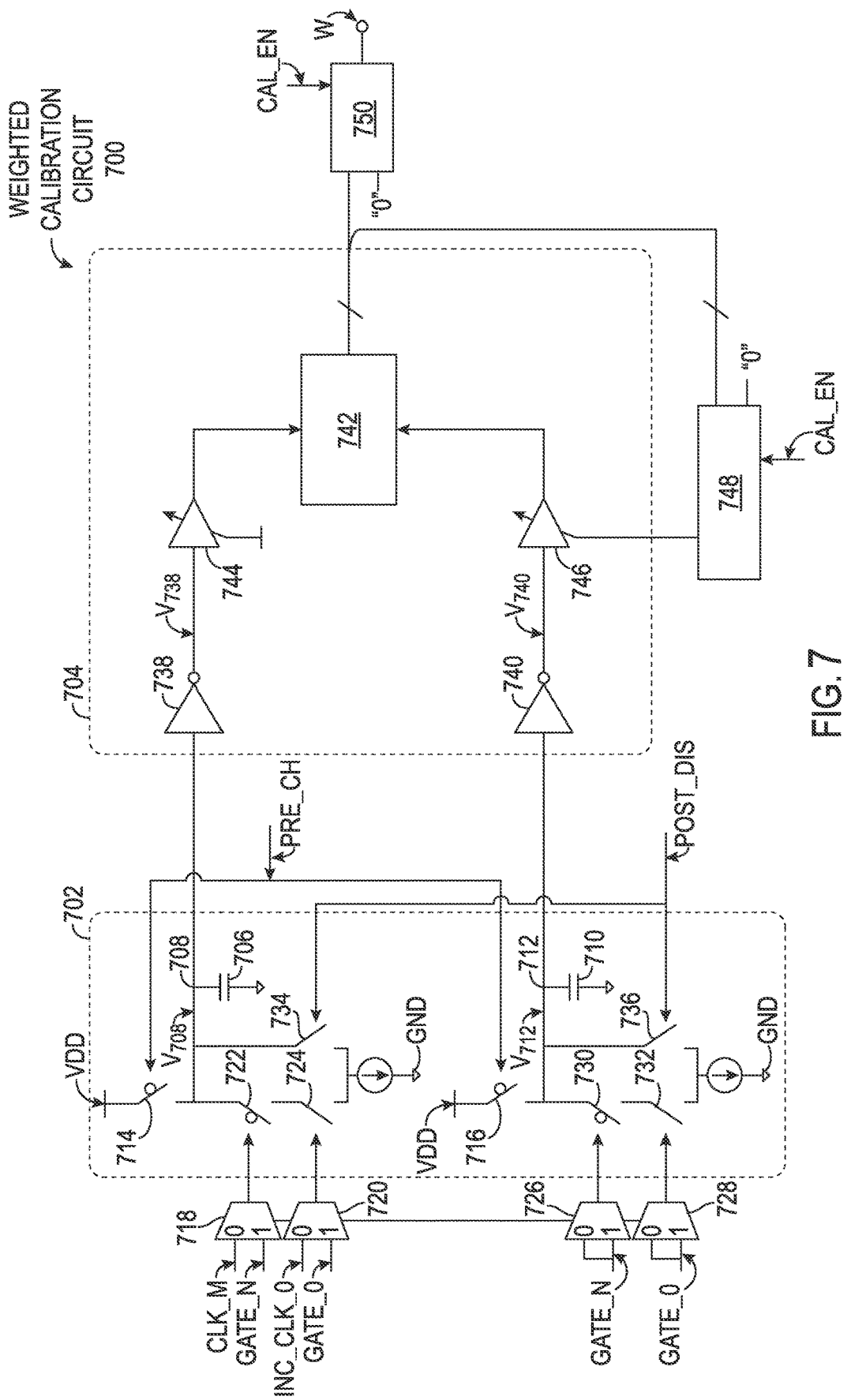
FIG. 7 is a schematic diagram of a weight calibration circuit configured to select a weight factor for the weighted summing PI in FIG. 5 that centers a middle interpolation code on a center of the phase range for interpolation.
Figure 12:
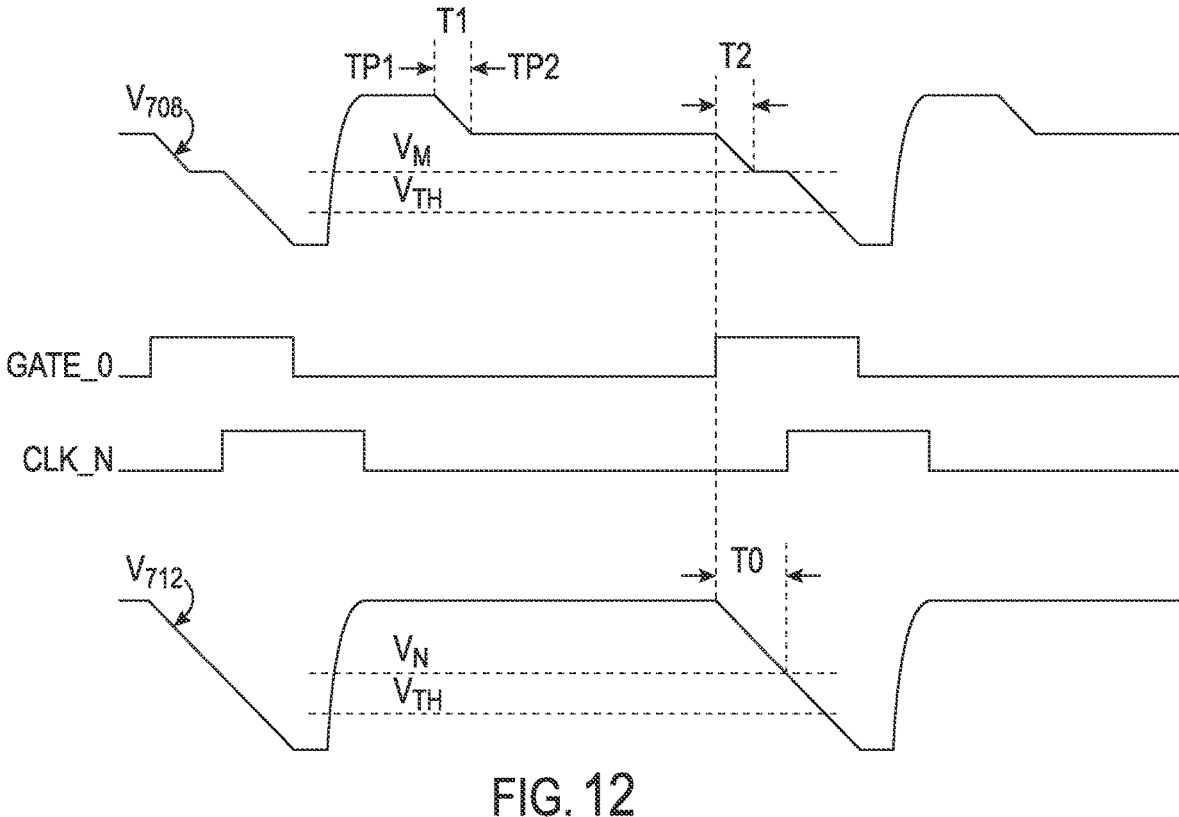
Figure 13:
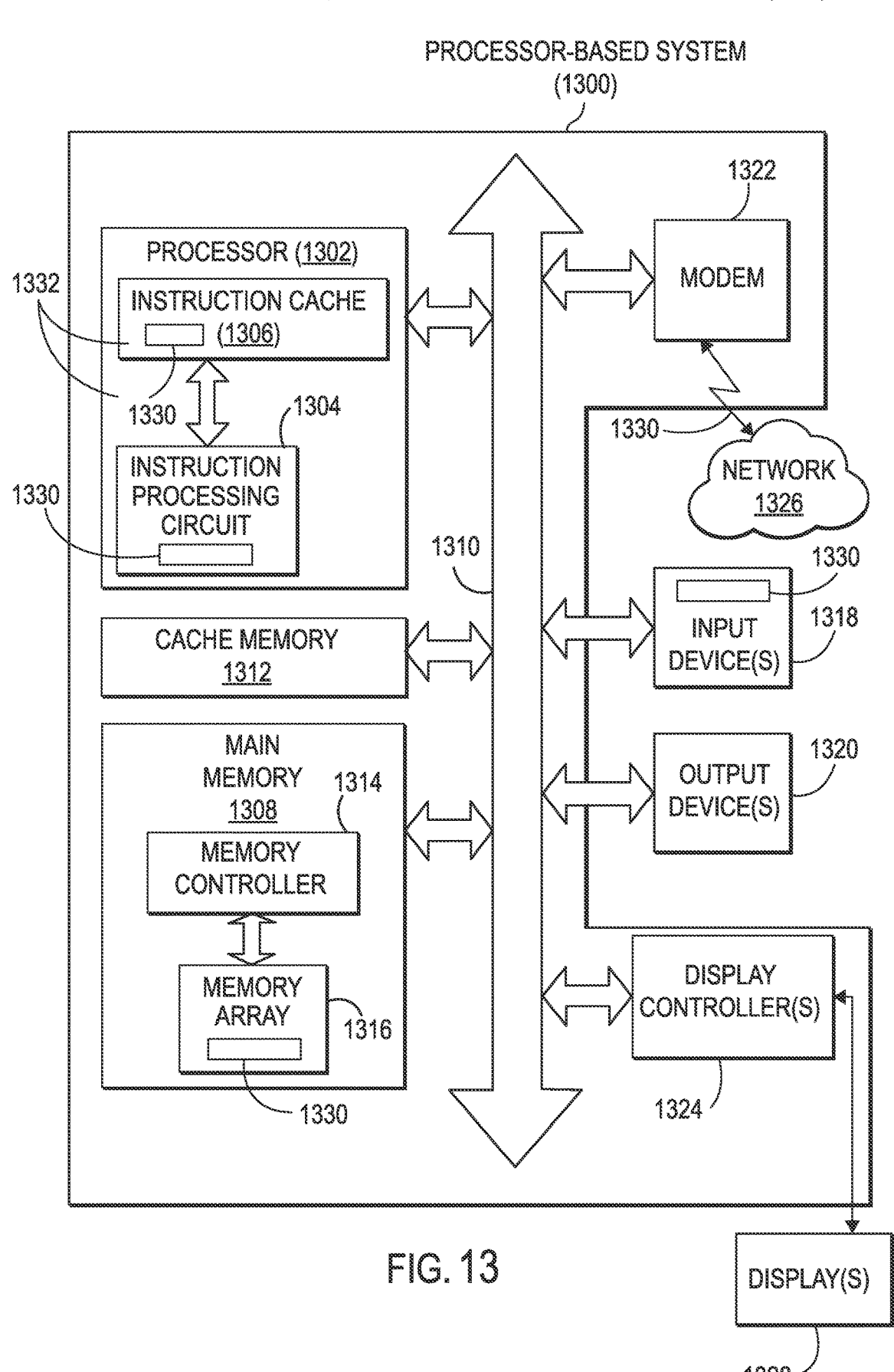

FIG. 12 is a diagram of control signals employed in the weight calibration circuit in FIG. 7 and voltage levels of capacitors employed in the weight calibration circuit in FIG. 7 to find a balanced weight signal to calibrate the weighted summing PI; and FIG. 13 is a block diagram of an exemplary processor-based system including a weighted summing PI, including a weighted summing circuit to generate a weighted sum of interpolated clocks generated in PI circuits employing offset interpolation codes for reduced INL.

DETAILED DESCRIPTION

With reference to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Exemplary aspects disclosed herein include a phase interpolator (PI) with a weighted summing circuit. Related methods of adjusting a PI to a limited range of integral non-linearity are also disclosed. In response to a range of interpolation codes, a PI circuit can generate a clock signal having a phase at one of a plurality of phases increments in a phase range between two reference clocks. Due to transistor non-linearity, the phase increments of an interpolated clock from a PI circuit may not be uniform divisions of the phase range. To compensate for the non-linearity, a second PI circuit receives a second interpolation code in a range of interpolation codes that are offset from those of the first PI circuit and the interpolated clocks of each PI circuit are added to compensate for their respective non-linearities. However, even if the non-linearities of the interpolated clocks have opposite polarities, they may have different magnitudes, so the phase increments of a summed interpolated clock may also be non-uniform. In an exemplary aspect, a weighted summing PI that sums interpolated clocks of two PI circuits includes a weighted summing circuit that employs a weight signal to generate a weighted summed interpolated clock having an interpolated phase, based on the weight signal, between the phases of the interpolated clocks. As a result, the phase of the weighted summed interpolated clock may be more influenced by the phase of one of the interpolated clocks from the two PI circuits than the other. In some examples, a weight calibration circuit may be included to select a balanced weight signal to reduce non-linearity in the weighted summing PI.

Figure 1:
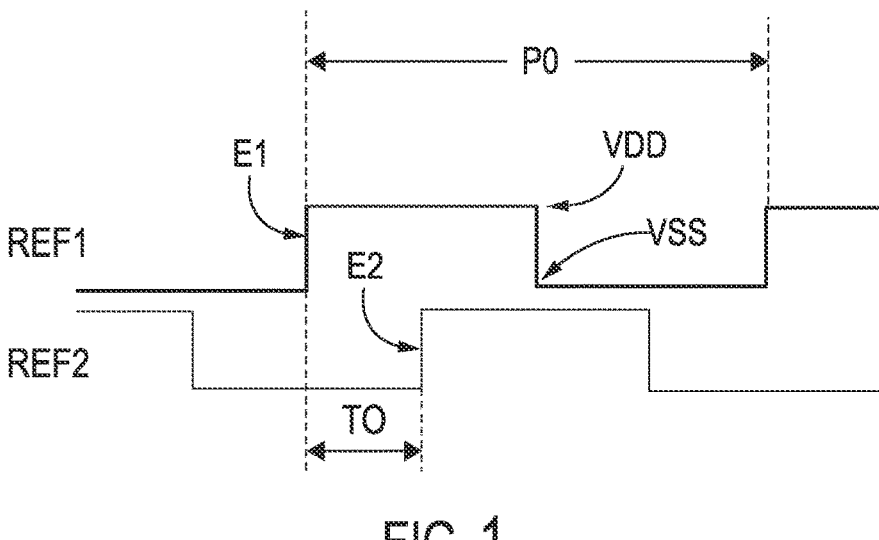
FIG. 1 is a timing diagram illustrating ideal timing of a first reference clock and a second reference clock that may be employed in a phase interpolator to generate an interpolated clock having a target phase.

FIG. 1 is a timing diagram showing two reference clocks, REF1 and REF2, having a same frequency but a phase difference of 90 degrees. Herein, a phase difference is indicated by a portion of a clock period that separates the rising edges (step increases in voltage) of the two reference clocks REF1 and REF2 from a low voltage (e.g., VSS or 0 volts) to a high voltage (e.g., VDD). In the time domain, a rising edge E1 of the reference clock REF1 precedes a rising edge E2 of the reference clock REF2 by a time period T0, where T0 is equal to one quarter (¼) of the cycle period P0 of the reference clocks REF1 and REF2. Thus, the reference clock REF1 is 90 degrees out of phase from (ahead of) the reference clock REF2. The reference clocks REF1 and REF2 in FIG. 1 are shown with ideal (e.g., zero-time) transitions from a low voltage to a high voltage at rising edges E1 and E2. Thus, for one-quarter of the period P0, the reference clock REF1 is at the high voltage, and the reference clock REF2 is at the low voltage.

Figure 2:
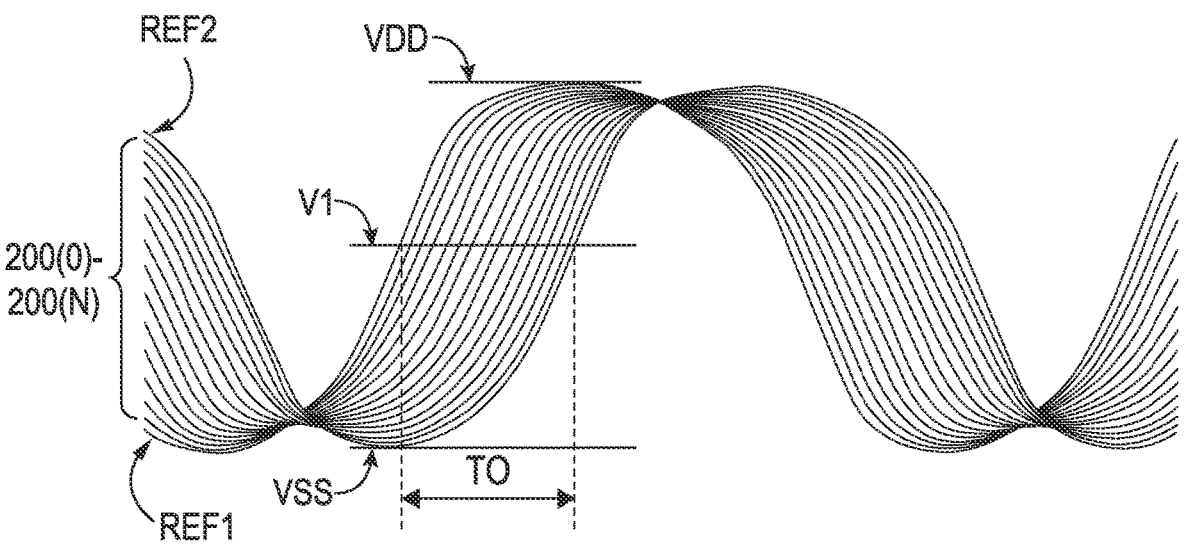
FIG. 2 is another timing diagram illustrating non-ideal timing of the first reference clock and the second reference clock and a plurality of interpolated clocks having phases between the first reference clock and the second reference clock and having equally divided phase increments between the reference clocks.

FIG. 2 is another timing diagram illustrating the first reference clock REF1 and the second reference clock REF2, with a more realistic (non-ideal) representation of timing, showing voltage steps from low to high and back to low over time. A time at which the reference clock REF1 crosses a threshold voltage V1 and a time at which the reference clock REF2 crosses the threshold voltage V1 are separated by the time T0.

The reference clocks REF1 and REF2 may be provided as system clocks to circuits that capture received data in response to a clock. Typically, neither the reference clock REF1 nor the reference clock REF2 arrives at a phase in the clock cycle that is optimal for capturing the data. For such situations, a PI circuit may be employed to generate an interpolated clock having a phase somewhere between reference clocks REF1 and REF2. A PI implemented as a complementary metal-oxide semiconductor (CMOS) transistor circuit may be configured to generate an interpolated clock at one of a plurality of incremental phases between the phases of the reference clock REF1 and the reference clock REF2. The interpolated clocks 200(0)-200(N) are equally, incrementally spaced between the reference clock REF1 and the reference clock REF2. In FIG. 2, the time period T0, which is the time corresponding to the phase difference between REF1 and REF2, is equally divided into a number "N" of equal phase increments, each of duration T0/N.

If the optimal moment to capture data is somewhere between the reference clock REF1 and the reference clock REF2, a closest one of the interpolated clocks 200(1)-200(N), may be generated to capture the data. An interpolation code may be provided to the PI to select a closest one of the interpolated clocks 200(1)-200(N). With equal divisions, a difference between the optimal point and the closest one of the interpolated clocks 200(1)-200(N) will be less than or equal to half the duration T0/N (e.g., T0/2N). However, generating interpolated clocks 200(1)-200(N) having equally spaced phase differences can be very difficult, if not impossible, due to transistor non-linearity, as discussed further below. As a result, interpolated clocks generated in a PI may not be spaced apart by equal phase differences.

Figures 3, 4:
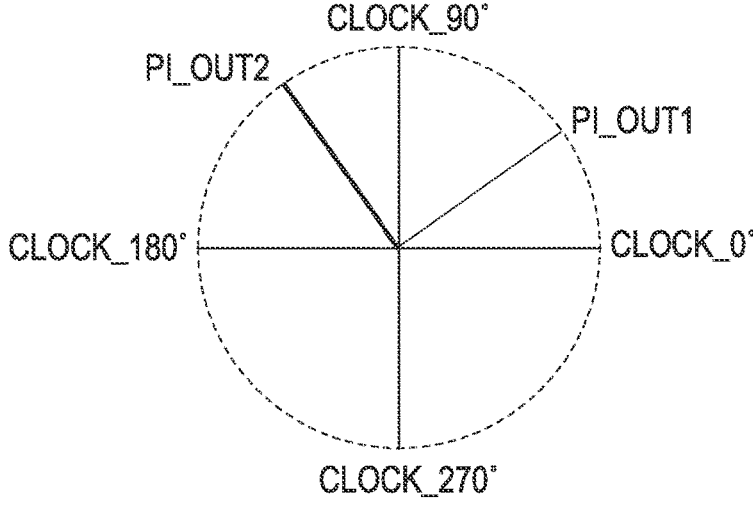
FIG. 3 is a radial diagram illustrating reference clocks having a same period but having respective phase differences of 90 degrees.
FIG. 4 is a timing diagram illustrating the phases and phase differences of the reference clocks in the time domain of FIG. 3.

FIG. 3 is a radial diagram illustrating reference clocks CLOCK_0, CLOCK_90, CLOCK_180, and CLOCK_270, having the same frequency but spaced apart by 90 degrees. A PI circuit may generate an interpolated clock between any two adjacent reference clocks (e.g., spaced by 90 degrees). For example, in FIG. 3, the interpolated clock PI_OUT1 may be generated by interpolation between the reference clocks CLOCK_0 and CLOCK_90, whereas the interpolated clock PI_OUT2 may be generated by interpolation between the reference clocks CLOCK_90 and CLOCK_180.

The reference clocks CLOCK_0, CLOCK_90, CLOCK_180, and CLOCK_270 and the interpolated clocks PI_OUT1 and PI_OUT2 are illustrated in the time domain in the timing diagram in FIG. 4.

Figure 5:
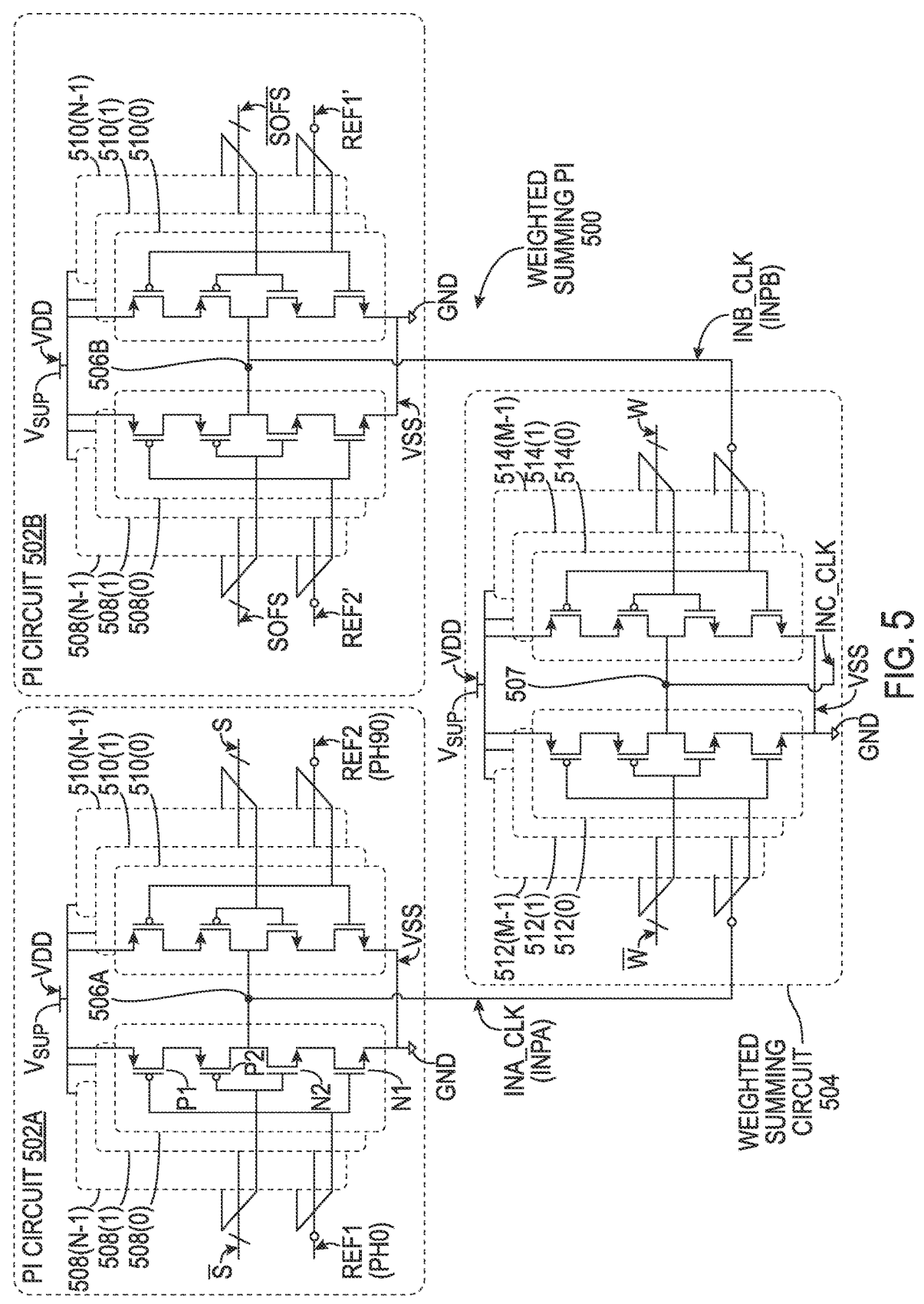
FIG. 5 is a schematic diagram of a weighted summing phase interpolator (PI) including first and second PI circuits providing first and second interpolated clocks and a weighted summing circuit to generate a third interpolated clock interpolated between first and second interpolated clocks based on a weight signal.

FIG. 5 is a schematic diagram of a weighted summing PI 500, including PI circuits 502A and 502B and a weighted summing circuit 504 configured to employ a weight signal W to generate a third, weighted summed interpolated clock INC_CLK at an interpolated phase INPC, based on the weight signal W, between an interpolated phase INPA of a first interpolated clock INA_CLK and an interpolated phase INPB of a second interpolated clock INB_CLK generated by the PI circuits 502A and 502B, respectively. The weight signal W comprises a first digital signal corresponding to the interpolated clock INA_CLK and a second digital signal corresponding to the interpolated clock INB_CLK.

The PI circuit 502A generates the interpolated clock INA_CLK on an output node 506A in response to an interpolation code S in a range of interpolation codes S(0)-S(N) (not shown). The interpolated clock INA_CLK has an interpolated phase INPA between a first reference phase PH0 of a first reference clock REF1 and a second reference phase PH90 of a second reference clock REF2. The first reference phase PH0 and the second reference phase PH90 may be 90 degrees out of phase with each other, like clocks CLOCK_0 and CLOCK_90 shown in FIG. 4, for example. Based on the range of interpolation codes S(0)-S(N), the interpolated phase INPA of the interpolated clock INA_CLK may be at any of N phase increments in the phase range T0 shown in FIG. 2.

The PI circuit 502B generates the interpolated clock INB on an output node 506B in response to interpolation code SOFS in a range of interpolation codes SOFS(0)-SOFS(N) (not shown). The interpolation codes SOFS(0)-SOFS(N) are different from the interpolation codes S(0)-S(N). That is, the interpolation codes SOFS(0)-SOFS(N) are offset from the interpolation codes S(0)-S(N) by a code offset OFS (not shown), such that SOFS(0) equals a sum of the interpolation code S(0) and the code offset OFS (e.g., SOFS(0)-S(0)+OFS).

Accordingly, the PI circuit 502B generates the interpolated clock INB_CLK at an interpolated phase INPB in a 90-degree phase range that is partially between the clocks CLOCK_0 and CLOCK_90 and partially between the clocks CLOCK_90 and CLOCK_180 in this example. As an example, referring back to FIG. 3, the PI circuit 502A may interpolate clocks between CLOCK_0 and CLOCK_90, while the PI circuit 502B may interpolate clocks between PI_OUT1 and PI_OUT2, which is a phase range of the same size but offset from that of the PI circuit 502A. The interpolated phase INPB of the interpolated clock INB_CLK may be at any one of N phase increments.

As explained further below, the weighted summing circuit 504 is employed to generate the interpolated clock INC_CLK having an interpolated phase INPC between the interpolated phase INPA of the interpolated clock INA_CLK and the interpolated phase INPB of the interpolated clock INB_CLK. The interpolated phase INPC may be closer to the interpolated phase INPA or the interpolated phase INPB, depending on or based on a weight signal W in a range of weight signals W(0)-W(M-1), as described further below.

The range of phases between the interpolated phase INPC and the interpolated phase INPB is divided into phase increments that are more uniform than those of the interpolated clocks INA_CLK and INB_CLK, providing more linear behavior from an unweighted sum of the interpolated clocks INA_CLK and INB_CLK. An "unweighted sum" in this context is the signal (e.g., voltage) resulting from providing the interpolated clock INA_CLK and the interpolated clock INB_CLK to a same node. The interpolated clock INC_CLK is generated on an output node 516 of the weighted summing circuit 504, as explained below.

Each of the PI circuit 502A includes first circuits 508(0)-508(N-1) that receive a first reference clock REF1 and second circuits 510(0)-510(N-1) that receive a second reference clock REF2. Each of the first circuits 508(0)-508(N-1), and the second circuits 510(0)-510(N-1), have a same structure of two P-type transistors (e.g., metal oxide semiconductor field effect transistors (MOSFETs)) P1 and P2 in series with two N-type transistors N1 and N2. As this structure of PI circuits is known in the art, the details of structure and operation of the first circuits 508(0)-508(N-1) and the second circuits 510(0)-510(N-1) are not explained in more detail here. The reference clocks REF1 and REF2 may be the reference clocks CLOCK_0 and CLOCK_90, respectively, as shown in FIGS. 3 and 4. The PI circuit 502B also includes the first circuits 508(0)-508(N-1) and the second circuits 510(0)-510(N-1). In the PI circuit 502B, the first circuits 508(0)-508(N-1) and the second circuits 510(0)-510(N-1) receive two adjacent reference clocks, referred to herein as REF1' and REF2', which may be either the reference clock REF1 and the reference clock REF2 or the reference clock REF2 and the reference clock REF3, depending on the interpolation code SOFS provided to the PI circuit 502B.

Operation of the first PI circuit 502A to generate the interpolated clock INA_CLK in response to the interpolation codes S(0)-S(N-1) is described as an example. It should be understood that the second PI circuit 502B operates in an identical manner but provides a different interpolated clock INB_CLK offset from the interpolated clock INA_CLK based on the interpolation codes SOFS(0)-SOFS(N). The first circuits 508(0)-508(N-1), and the second circuits 510(0)-510(N-1), are activated in response to the reference clocks REF1 and REF2 based on the number of binary ones ("1"s) and zeros ("0"s) in the interpolation codes S(0)-S(N). Examples include the interpolation code S(0)="0000 . . . 0000", the interpolation code S(1)="0000 . . . 0001", the interpolation code S(N-1)="0111 . . . 1111", and the interpolation code S(N)="1111 . . . 1111". The range of the interpolation codes S(0)-S(N) may be known as a thermometer code, in which the number of "1"'s increases (e.g., from the right to the left). Each of the interpolation codes S(0)-S(N) includes N bits. That is, one of the first circuits 508(0)-508(N-1), and one of the second circuits 510(0)-510(N-1), are controlled by a bit of the interpolation code S. For example, in response to the right-most bit of S being in the high voltage ("1") state, the corresponding first circuit 508(0) is configured to couple the output node 506A to a supply voltage source $V_{SUP}$ in response to the reference clock REF1 being in the low voltage ("0") state and the corresponding second circuit 510(0) is configured to couple the output node 506A to a reference voltage source GND in response to the reference clock REF2 being in the high voltage state. On the other hand, in response to the right-most bit of S being in the low voltage ("0") state, the corresponding first circuit 508(0) is configured to couple the output node 506A to the reference voltage source GND in response to the reference clock REF1 being in the high voltage state and the corresponding second circuit 510(0) is configured to couple the output node 506A to the supply voltage source $V_{SUP}$ in response to the reference clock REF2 being in the low voltage state.

Each of the bits of the interpolation code S controls one of the first circuits 508(0)-508(N−1), and one of the second circuits 510(0)-510(N−1), in this manner. As a result, the voltage at the output node 506A has a voltage transition at a phase or time somewhere between the first reference phase PH0 of the first reference clock REF1 and the second reference phase PHI of the second reference clock REF2. That phase or time of the voltage transition on the output node 506A determines the interpolated phase INPA of the interpolated clock INA_CLK, and depends on the interpolation code S.

In an ideal PI that operates linearly, an incremental change from one of the interpolation codes S(0)-S(N) (e.g., S(X)) to the next interpolation code (e.g., S(X+1)), for example, where X is any number from 0 to N−1, would cause a uniform change in a phase of the interpolated clock INA_CLK equal to the time T0/N (see FIG. 2). In other words, in a linear PI, the phase increments of the interpolated clock INA_CLK would be uniformly separated by a phase difference equal to a time T0/N at the frequency of the interpolated clock INA_CLK. However, due to the transistor non-linearity in the PI circuits 502A and 502B, an incremental increase in interpolation code S(X) may produce a phase change equal to a time that is more than or less than T0/N. This difference from the uniform division (e.g., T0/N) is referred to as an integral non-linearity (INL), which may be positive or negative.

As noted previously, the PI circuit 502B operates in the same manner as the PI circuit 502A, where the interpolated phase INPB of the interpolated clock INB_CLK is determined by a timing or phase of a voltage transition on the output node 506B, which is determined by the interpolation code SOFS.

The weighted summing circuit 504 includes first circuits 512(0)-512(M−1) and second circuits 514(0)-514(M−1), which correspond respectively to the first circuits 508(0)-508(N−1) and the second circuits 510(0)-510(N−1) in the PI circuits 502A and 502B. The weighted summing circuit 504 generates the interpolated signal INC_CLK on an output node 516, where the interpolated phase INPC of the interpolated clock INC_CLK is determined by a timing or phase of a voltage transition on the output node 516, which is determined by the weight signal W. As each of the PI circuits 502A and 502B and the weighted summing circuit 504 provide an inverted output, the voltage transition on the output node 516 is a rising transition corresponding to the rising edges E1 and E2 of the reference clocks REF1 and REF2.

The number M of the first circuits 512(0)-512(M−1) and the second circuits 514(0)-514(M−1) is equal to the number M of bits in the weighted signal W, having values W(0)-W(M−1). Thus, in the weighted summing circuit 504, one of the first circuits 512(0)-512(M−1), and one of the second circuits 514(0)-514(M−1), are controlled by a bit of the weight signal W. For example, in response to the right-most bit of the weight signal W being in the high voltage ("1") state, the corresponding first circuit 512(0) is configured to couple the output node 516 to a supply voltage source $V_{SUP}$ in response to the interpolated clock INA_CLK being in the low voltage ("0") state and the corresponding second circuit 514(0) is configured to couple the output node 516 to the reference voltage source GND in response to the interpolated clock INB_CLK being in the high voltage state. On the other hand, in response to the right-most bit of the weight signal W being in the low voltage ("0") state, the corresponding first circuit 512(0) is configured to couple the output node 516 to the reference voltage source GND in response to the interpolated clock INA_CLK being in the high voltage state and the corresponding second circuit 514(0) is configured to couple the output node 516 to the supply voltage source $V_{SUP}$ in response to the interpolated clock INB_CLK being in the low voltage state.

The weight signal W is provided as a first digital signal W corresponding to the first interpolated clock INA_CLK and is provided as a second digital signal W_BAR corresponding to the second interpolated clock INB_CLK. The second digital signal W_BAR is a digital inverse of the first digital signal W (e.g., a "0" in a bit position in W is a "1" in the same bit position in W_BAR and a "1" in W is a "0" in W_BAR). The interpolated clock INC_CLK is generated by a first number of the first circuits 512(0)-512(M−1), where the first number is indicated by the first digital signal W, and a second number of the second circuits 514(0)-514(M−1), where the second number is indicated by the second digital signal W_BAR.

The interpolation code S(0) is a minimum interpolation code in the range of interpolation codes S(0)-S(N) and the interpolation code S(N) is a maximum interpolation code in such range. A middle interpolation code S(N/2) is halfway between the minimum interpolation code S(0) and the maximum interpolation code S(N). Because the interpolated clock INC_CLK is interpolated between the first interpolated clock INA_CLK and the second interpolated clock INB_CLK, the interpolated phase INPC of the interpolated clock INC_CLK is in a phase range from an early interpolated phase INPC0, based on the interpolation code S(0) provided to the PI circuit 502A, and a late interpolated phase INPC90, based on the interpolation code S(N) provided to the PI circuit 502A.

Figure 6A:
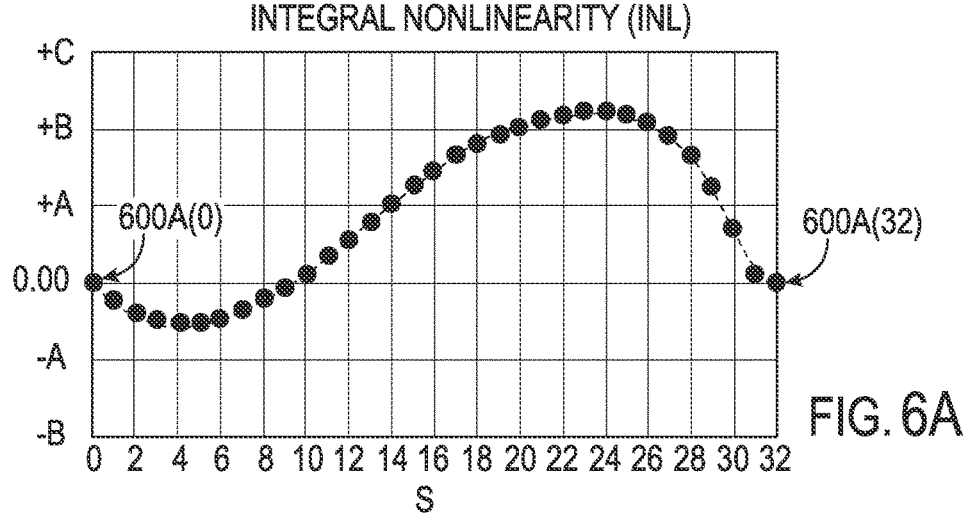
FIGS. 6A and 6B are graphical representations of the integral non-linearity (INL) measurements of the interpolated clock signals generated in a range of interpolation codes by the offset PI circuits in FIG. 5.
Figure 6B:
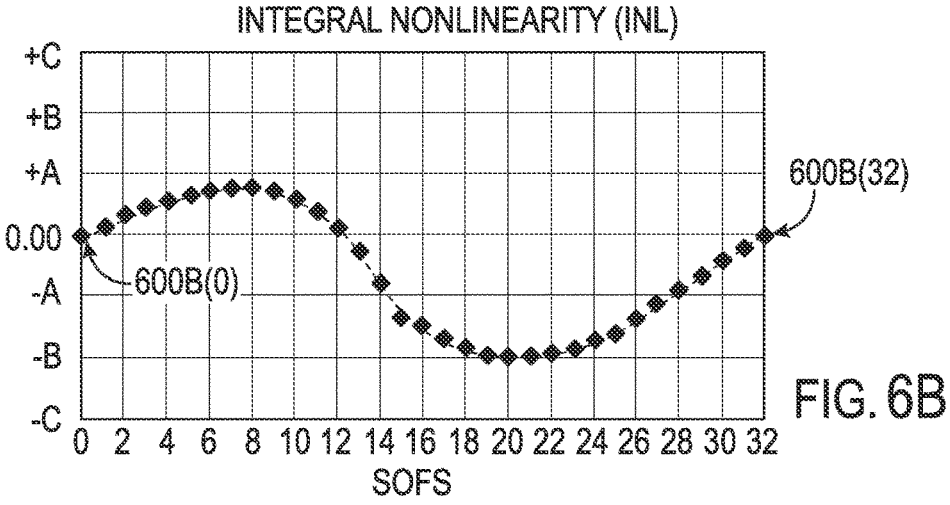

FIGS. 6A and 6B are graphical representations of INLs 600A(0)-600A(32) and 600B(0)-600B(32) of the interpolated clocks INA_CLK and INB_CLK generated in the PI circuits 502A and 502B at each of the phase increments corresponding to interpolation codes S(0)-S(N) and SOFS (0)-SOFS(N) where N=32 in this case. The INLs above and below the 0.00 level indicate unequal divisions of the 90-degree phase difference between the reference clocks REF1 and REF2. Although FIGS. 6A and 6B show only interpolation codes S(0)-S(32), the PI circuits 502A and 502B may employ any appropriate integer number of interpolation codes S.

A data capture clock having a low (e.g., near zero) INL across all interpolation codes S makes it possible to capture data at any phase within the phase range T0 with minimal errors. A mechanism for generating such a data capture clock is to add the interpolated clock INA_CLK to the interpolated clock INB_CLK. The interpolation codes SOFS(0)-SOFS (N) are offset from the interpolation codes S(0)-S(N) by an offset OFS that is chosen to produce the interpolated clock INB_CLK having INLs opposite in polarity and similar in magnitude to the INLs of the interpolated clock INA_CLK over the range of S(0)-S(N). Thus, a sum of these clocks would have more linear incremental changes between the reference clock REF1 and the reference clock REF2.

Figure 6C:
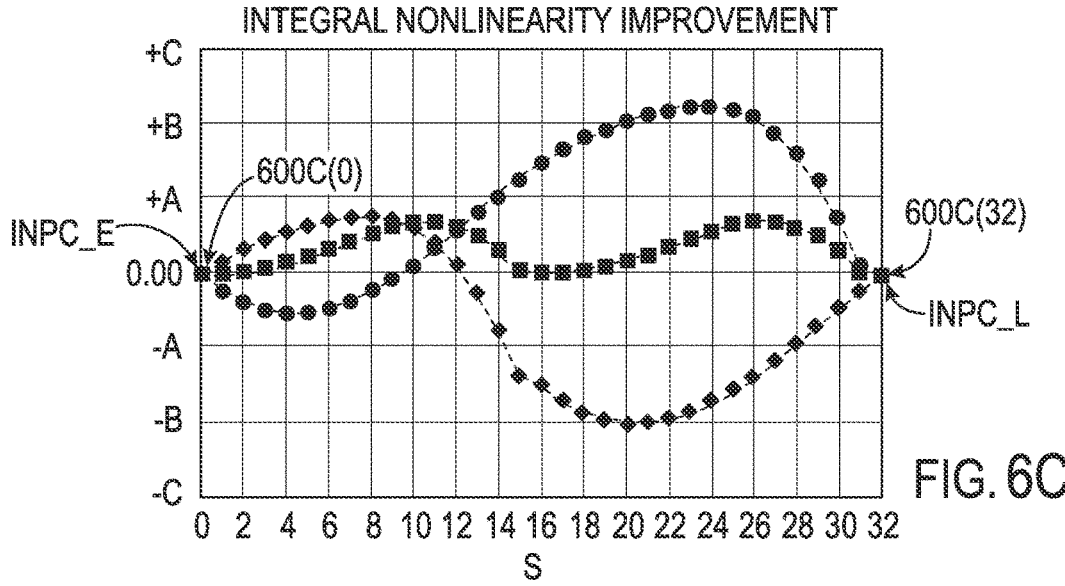
FIG. 6C is a graphical representation of the INL measurements in a range of interpolation codes for the offset PI circuits and the weighted summing PI circuit in FIG. 5.

However, there may not be an offset OFS at which the interpolated clocks INA_CLK and INB_CLK have INLs of equal magnitude and opposite polarity over the whole range of the interpolation clocks S(0)-S(N) and SOFS(0)-SOFS (N). For example, as shown in FIG. 6C, a result of summing the interpolated clocks INA_CLK and INB_CLK provides improved INLs, but further improvement would still be desirable to reduce data capture errors. The INLs 600C(0)-600C(32) are the sums of the INLs 600A(0)-600A(32) and 600B(0)-600B(32). It can be seen in FIG. 6C that the INLs 600C(0)-600C(32) are typically smaller in magnitude, in most cases over the entire range of interpolation codes S and SOFS than either of the interpolated clocks INA_CLK and INB_CLK. However, as shown, some of the INLs 600C(0)-600C(32) still reach an undesirable magnitude.

Where the INLs 600A of the interpolated clock INA_CLK and the INLs 600B of the interpolated clock INB_CLK are of opposite polarity but different in magnitude, it may be beneficial to increase the effect or weight of one of the interpolated clocks INA_CLK and INB_CLK over the other in the clock created by summation. Thus, the weighted summing circuit 504 in FIG. 5 is employed to apply a weight W to generate the weighted summed clock INC_CLK. The weighted summing circuit 504 operates in the same manner as the PI circuits 502A and 502B but, rather than receiving the reference clocks REF1 and REF2 and the interpolation codes S, as in PI circuit 502A, the weighted summing circuit 504 receives the interpolated clocks INA_CLK and INB_CLK and the weight W. The weighted summing circuit includes first circuits 512(0)-512(M-1) and second circuits 514(0)-514(M-1), which may be identical to the first and second circuits 508(0)-508(N-1) and 510(0)-510(N-1). First circuits 512(0)-512(M-1) are controlled by the weight W, which is a binary value of a thermometer code having "M" bits. The first circuits 512(0)-512(M-1) are also controlled by the interpolated clock INB_CLK. The second circuits 514(0)-514(M-1) are controlled by the inverse of the weight W (W_BAR) and the interpolated clock INA_CLK. A number of 1's and 0's in the weight W determines which of the interpolated clocks INA_CLK and INB_CLK has a greater weight in a weighted summed clock INC_CLK. Naturally, at different interpolation codes, the weight W that produces the best result (e.g., INL closest to 0.00) in the weighted summed clock INC_CLK may vary.

As noted above, depending on the range of interpolation codes S(0)-S(N), the interpolated phase INPC of the interpolated clock INC_CLK may be in a range from an early phase INPC_E, which is the phase INPC corresponding to the minimum interpolation code S(0), to a late phase INPC_L, which is the phase INPC corresponding to the maximum interpolation code S(N). One indication of linear performance in a PI circuit is that a middle interpolation code (e.g., S(N/2) in the range of interpolation codes S(0)-S(N)) causes the weighted summing PI 500 to generate the interpolated clock INC_CLK having an interpolated phase INPC at a middle phase halfway between the early phase INPC_E based on the minimum interpolation code S(0) and the late phase INPC_L based on the maximum interpolation code S(N). In this regard, N is always an even number.

Although the term "halfway" is used here, even in a linear PI circuit, the middle phase may not be exactly halfway between the early phase INPC_E and the late phase INPC_L of the interpolated phase INPC, depending on whether a number of interpolation codes S is even or odd, or due to non-linearity, for example. For example, when the phase range between the early phase INPC_E and the late phase INPC_L of the interpolated phase INPC is ninety (90) degrees, it may be that none of the interpolation codes S(0)-S(N) produce an interpolated clock INC_CLK at forty-five (45) degrees between them, due to non-linearity. Thus, the term "middle phase" as used herein is intended to refer to a phase that is closer to a point halfway between the early phase INPC_E and the late phase INPC_L than an interpolated phase INPC would be in response to an interpolation code incrementally higher or lower than S(N/2). In other words, the interpolated phase INPC of the interpolated clock is at the middle phase if the next higher interpolation code S ((N/2)+1) and the next lower interpolation code S ((N/2)-1) each generate an interpolation phase INPC that is farther (in opposite directions) from the interpolation phase INPC generated by the middle interpolation code S(N/2). In addition, the interpolated phase INPC generated in response to the middle interpolation code S(N/2) may depend on the weight signal W.

In this regard, to improve the linearity of the weighted summing PI 500 in FIG. 5, a weight calibration circuit 700 illustrated in FIG. 7 may be coupled to the weighted summing PI 500 and configured to determine a balanced weight signal W comprising a value at which a phase INPC of the interpolated clock INC_CLK in FIG. 5 is in the middle of the range between the early phase INPC_E and the late phase INPC_L of FIG. 6C in response to a middle interpolation code S(N/2). In some examples, due to non-linearity, the interpolated phase INPC of the interpolated clock INC_CLK in response to the middle interpolation code S(N/2) is not half way between the early phase INPC_E and the late phase INPC_L, which causes an imbalance between the phase increments due to interpolation codes S(0)-S(N/2) and the phase increments due to interpolation codes S(N/2)-S (N). In the description of FIG. 7, references may be made to features in any of FIGS. 1-6C.

The weight calibration circuit 700 includes a phase range measurement circuit 702 configured to determine a first time period T0 corresponding to the phase range between the early phase INPC_E and the late phase INPC_L of the interpolated phase INPC. This time period also depends on frequency (see FIGS. 3 and 4, for example). The phase range measurement circuit 702 also determines a second time period T1 from the early phase INPC_E and a test phase INPC_T (not shown) of the interpolated clock INC_CLK generated in response to the middle interpolation code S(N/2) in a first test period of the first reference clock REF1 provided to the weighted summing PI 500 in FIG. 5. Ideally, it would be expected that the second time period T1 would be half of the time period T0.

The phase range measurement circuit 702 also determines a third time period T2 between the early phase INPC_E and the test phase INPC_T of the interpolated clock INC_CLK in response to the middle interpolation code S(N/2) in a second test period of the first reference clock REF1. In other words, the weight calibration circuit 700 measures the time period T1 a second time in another clock cycle and refers to such measure as T2.

The weight calibration circuit 700 also includes a weight adjustment circuit 704 configured to adjust the value of the weight signal W in response to determining that a sum of the second time period T1 and the third time period T2 is greater than the first time period T0. The time periods T0, T1, and T2 are illustrated and explained with reference to FIG. 12 below.

In more detail, the phase range measurement circuit 702 includes a capacitor 706 coupled between a node 708 and the reference voltage source GND and a capacitor 710 coupled between a node 712 and the reference voltage source GND. In a calibration mode (indicated by CAL_EN), the capacitors 706 and 710 are both charged to a supply voltage VDD in response to switches 714 and 716 being closed by a pre-charge signal PRE_CH. The pre-charge signal PRE_CH and a post discharge signal POST_DIS are synchronized to the reference clock REF1 by the synchronization signals GATE_0 and GATE_N.

In a first cycle of the reference clock REF1 during the calibration mode, selectors 718 and 720 control switches 722 and 724 to discharge the capacitor 706 for a time period T1 from an interpolated clock INC_CLK_0 (based on the minimum interpolation code S(0)) and an interpolated clock INC_CLK_M (based on the middle interpolation code S(N/2)). The time period T1 extends from the early phase INPC_E (based on the minimum interpolation code S(0)) to the test phase INPC_T of the interpolated clock INC_CLK_M, which is based on middle interpolation code S(N/2). Selector 718 selects one of CLK_M and GATE_N, and selector 720 selects one of INC_CLK_0 and GATE_0, which are created by control circuit 900 in FIG. 9.

In a second cycle of the reference clock REF1, the capacitor 706 is again discharged in the same manner for a time period T2 from the early phase INPC_E to the test phase INPC_T. Thus, capacitor 706 is discharged for the time period T1 and the time period T2. Additionally, between the interpolated clock INC_CLK_0 and the interpolated clock INC_CLK_N (based on the maximum interpolation code S(N)), selectors 726 and 728 control switches 730 and 732 to discharge the capacitor 710 for the time period T0 from the early phase INPC_E to the late phase INPC_L.

If the test phase INPC_T is the middle phase, halfway between the early phase INPC_E and the late phase INPC_L, the sum of time periods T1 and T2 would be equal to the time period T0. In the phase range measurement circuit 702, a voltage $V_{708}$ on the node 708 and a voltage $V_{712}$ on the node 712 would be the same if the sum of time periods T1 and T2 for discharging the capacitor 706 was equal to the time period T0 for discharging the capacitor 710. The switches 734 and 736 are controlled by the post discharge signal POST_DIS to further discharge the capacitors 706 and 710 at the same rate until a threshold voltage $V_{TH}$ is reached. The times at which the respective capacitors 706 and 710 reach the threshold voltage $V_{TH}$ indicates whether the sum of time periods T1 and T2 is greater than the time period T0, as determined by the weight adjustment circuit 704. The weight adjustment circuit 704 includes inverters 738 and 740 to invert the voltages $V_{708}$ and $V_{712}$ to create voltages $V_{738}$ and $V_{740}$ seen as rising voltages on the phase detector 742 and determines which of the voltages $V_{738}$ and $V_{740}$ rose first. Delay circuits 744 and 746 and accumulator 748 are employed to compensate for imbalances in the weight calibration circuit 700. Accumulator 750 incrementally adjusts the weight signal W in response to the output of the phase detector 742 until the rising voltage $V_{738}$ occurs after the rising voltage $V_{740}$. The resulting weight signal W is the balanced weight signal.

In the calibration mode, the weight signal W is initiated at the maximum weight signal W(M−1), starting the test phase INPC_T closer to the late phase INPC_L, such that the sum of T1 and T2 will initially be less than the time period T0. Each time the above sequence is performed, the weight signal W is decreased until the sum of time period T1 and time period T2 is greater than the time period T0.

FIG. 8 is a flowchart illustrating a method 800 in the weighted summing PI 500 in FIG. and optionally including the weight calibration circuit 700 in FIG. 7. The method 800 includes generating, in a first PI circuit 502A, a first interpolated clock INA_CLK having a first interpolated phase INPA in response to a first interpolation code S (block 802) and generating, in a second PI circuit 502B, a second interpolated clock INB_CLK having a second interpolated phase INPB in response to a second interpolation code SOFS (block 804). The method 800 further includes generating, based on a weight signal W, a third interpolated clock INC_CLK at a third interpolated phase INPC between the first interpolated phase INPA and the second interpolated phase INPB (block 806).

Figure 9:
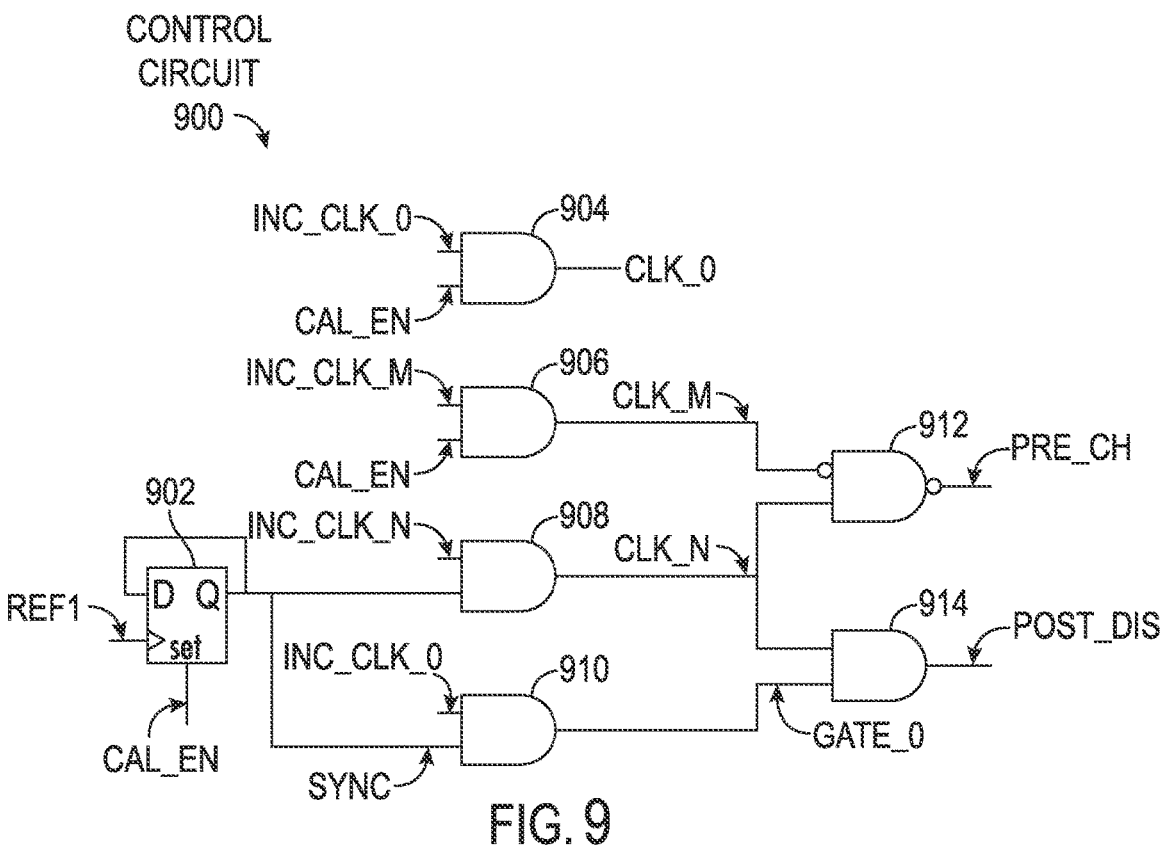
FIG. 9 is a schematic diagram of logic circuits for generating signals to control the weight calibration circuit in FIG. 7 based on the interpolation clocks generated by the weighted summing PI in FIG. 5.

FIG. 9 is a schematic diagram of a control circuit 900 including logic circuits 902-914 for generating signals to control the weight calibration circuit 700 in FIG. 7. Dummy PI circuits (not shown) are employed to generate an early phase clock INC_CLK_0 equivalent to the interpolated clock INC_CLK based on the minimum interpolation code S(0) and a late phase clock IN_CLK_N equivalent to the interpolated clock INC_CLK based on the maximum interpolation code S(N). A calibration clock INC_CLK_M is the interpolated clock INC_CLK generated at the test phase INPC_T by the weighted summing PI in FIG. 500 in response to the middle interpolation code S(N/2). The control circuit 900 receives the interpolated clocks PI_0, PI_N/2, and PI_N and the reference clock REF1 and generates a synchronization signal SGATE to synchronize the pre-charge signal PRE_CH and the post discharge signal POST_DIS to the reference clock REF1.

Figure 10:
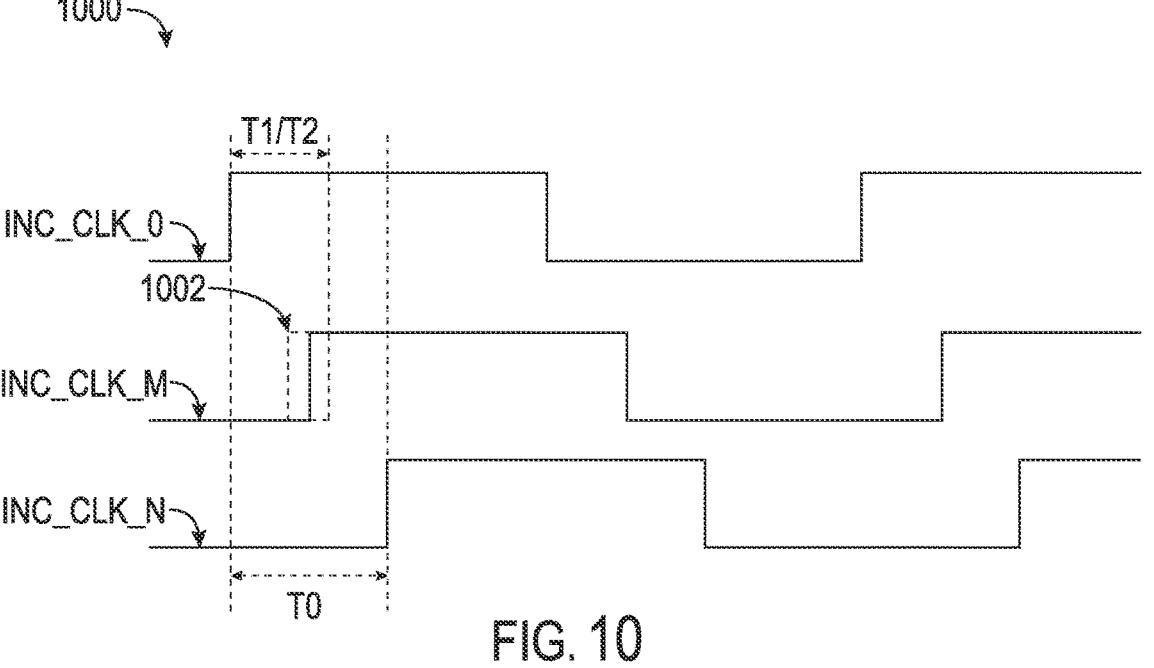
FIG. 10 is a timing diagram of the signals generated in the weighted summing PI in FIG. 5 to illustrate an adjustment of the middle interpolation code provided by the weight calibration circuit in FIG. 7.

FIG. 10 is a timing diagram 1000 of the interpolated clocks PI_0, PI_N/2, and PI_N received in the control circuit 900. Timing diagram 1000 shows a calibration window 1002 of the calibration clock PI_N/2 relative to the early and late phase clocks PI_0 and PI_N based on the weight calibration circuit 700.

Figure 11:
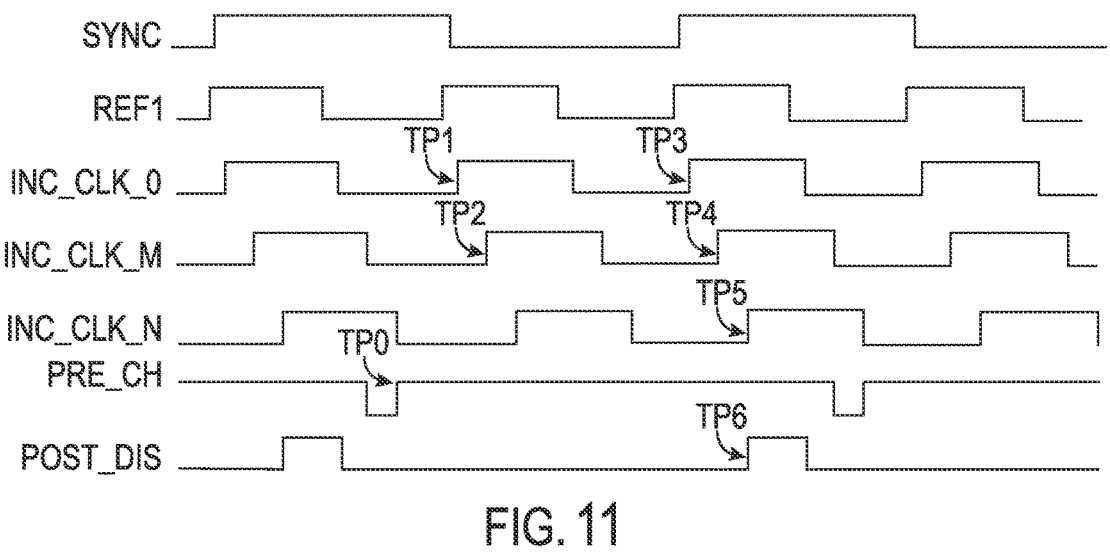
FIG. 11 is a timing diagram showing the interpolated clocks and timing signals generated in the control circuit in FIG. 9 for controlling the weight calibration circuit in FIG. 7.

FIG. 11 is a timing diagram showing relative timing of signals in the control circuit 900 and is explained with reference to the schematic diagram of FIG. 7 and the timing and voltage diagrams in FIG. 12. At time point TP0, the pre-charge signal PRE_CH is done charging the capacitors 706 and 710 in FIG. 7. From time point TP1 to time point TP2 (time period T1), the switches 722 and 724 begin discharging the capacitor 706. From time point TP3 to time point TP4 (time period T2), the switches 722 and 724 again discharge the capacitor 706 to the voltage $V_M$. From time point TP3 to time point TP5 (time period T0), the switches 730 and 732 discharge the capacitor 710 to a voltage $V_N$. Since the capacitor 706 and the capacitor 710 are a same size, are charged to the same initial voltage VDD, and are designed to discharge at a same rate, a difference between the sum of time T1 plus time T2 and time T0 is indicated by a difference between voltage $V_M$ on the node 708 and voltage $V_N$ on the node 712. This difference is identified by further discharging both of the capacitors 706 and 710 at the same time and determining which of the voltages VIM and $V_N$ reaches a threshold voltage $V_{TH}$ first. This determination is made by the weight adjustment circuit 704, which adjusts the weight signal W based on the determination.

FIG. 12 is a diagram of the interpolated clocks INC_CLK_0 and INC_CLK_N generated by the weighted summing PI in FIG. 5 and voltages $V_{708}$ on the node 708 and voltage $V_{712}$ on the node 712 in the weight calibration circuit 700 in FIG. 7. FIG. 12 illustrates the discharge phases employed in the calibration mode to measure the time periods T0, T1, and T2.

FIG. 13 is a block diagram of an exemplary processor-based system 1300 that includes a processor 1302 (e.g., a microprocessor), including an instruction processing circuit 1304. The processor-based system 1300 may be a circuit or circuits included in an electronic board card, such as a printed circuit board (PCB), a server, a personal computer, a desktop computer, a laptop computer, a personal digital assistant (PDA), a computing pad, a mobile device, or any other device, and may represent, for example, a server, or a user's computer. In this example, the processor-based system 1300 includes the processor 1302. The processor 1302 represents one or more general-purpose processing circuits, such as a microprocessor, central processing unit, or the like. More particularly, the processor 1302 may be an EDGE instruction set microprocessor or other processor implementing an instruction set that supports explicit consumer naming for communicating produced values resulting from execution of producer instructions. The processor 1302 is configured to execute processing logic in instructions for performing the operations and steps discussed herein. In this example, the processor 1302 includes an instruction cache 1306 for temporary, fast access memory storage of instructions accessible by the instruction processing circuit 1304. Fetched or prefetched instructions from a memory, such as a main memory 1308, over a system bus 1310, are stored in the instruction cache 1306. Data may be stored in a cache memory 1312 coupled to the system bus 1310 for low-latency access by the processor 1302. The instruction processing circuit 1304 is configured to process instructions fetched into the instruction cache 1306 and process the instructions for execution.

The processor 1302 and the main memory 1308 are coupled to the system bus 1310 and can intercouple peripheral devices included in the processor-based system 1300. As is well known, the processor 1302 communicates with these other devices by exchanging address, control, and data information over the system bus 1310. For example, the processor 1302 can communicate bus transaction requests to a memory controller 1314 in the main memory 1308 as an example of a slave device. Although not illustrated in FIG. 13, multiple system buses 1310 could be provided; wherein each system bus 1310 constitutes a different fabric. In this example, the memory controller 1314 is configured to provide memory access requests to a memory array 1316 in the main memory 1308. The memory array 1316 is comprised of an array of storage bit cells for storing data. The main memory 1308 may be a read-only memory (ROM), flash memory, dynamic random-access memory (DRAM), such as synchronous DRAM (SDRAM), etc. and/or static memory (e.g., flash memory, SRAM, etc.), as non-limiting examples.

Other devices can be connected to the system bus 1310. As illustrated in FIG. 13, these devices can include the main memory 1308, one or more input device(s) 1318, one or more output device(s) 1320, a modem 1322, and one or more display controllers 1324, as examples. The input device(s) 1318 can include any type of input device, including but not limited to input keys, switches, voice processors, etc. The output device(s) 1320 can include any type of output device, including but not limited to audio, video, other visual indicators, etc. The modem 1322 can be any device configured to allow an exchange of data to and from a network 1326. The network 1326 can be any type of network, including but not limited to a wired or wireless network, a private or public network, a local area network (LAN), a wireless local area network (WLAN), a wide area network (WAN), a BLUETOOTH™ network, and the Internet. The modem 1322 can be configured to support any type of communications protocol desired. The processor 1302 may also be configured to access the display controller(s) 1324 over the system bus 1310 to control information sent to one or more displays 1328. The display(s) 1328 can include any type of display, including but not limited to a cathode ray tube (CRT), a liquid crystal display (LCD), a plasma display, etc.

The processor-based system 1300 in FIG. 13 may include a set of instructions 1330 to be executed by the processor 1302 for any application desired according to the instructions. The instructions 1330 may be stored in the main memory 1308, processor 1302, and/or instruction cache 1306 as examples of a non-transitory computer-readable medium 1332. The instructions 1330 may also reside, completely or at least partially, within the main memory 1308 and/or within the processor 1302 during their execution. The instructions 1330 may further be transmitted or received over the network 1326 via the modem 1322, such that the network 1326 includes computer-readable medium 1332.

Any of the circuits in the processor-based system 1300 coupled to the system bus 1310, and in particular the modem 1322 and the output devices 1320, may include a weighted summing PI corresponding to the weighted summing PI 500 in FIG. 5 and optionally including the weight calibration circuit 700 in FIG. 7 and including the control circuit 900 in FIG. 9.

While the computer-readable medium 1332 is shown in an exemplary embodiment to be a single medium, the term "computer-readable medium" should be taken to include a single medium or multiple media (e.g., a centralized or distributed database and/or associated caches and servers) that store the one or more sets of instructions. The term "computer-readable medium" shall also be taken to include any medium that is capable of storing, encoding, or carrying a set of instructions for execution by the processing device and that causes the processing device to perform any one or more of the methodologies of the embodiments disclosed herein. The term "computer-readable medium" shall accordingly be taken to include, but not be limited to, solid-state memories, optical medium, and magnetic medium.

The embodiments disclosed herein include various steps. The steps of the embodiments disclosed herein may be formed by hardware components or may be embodied in machine-executable instructions, which may be used to cause a general-purpose or special-purpose processor programmed with the instructions to perform the steps. Alternatively, the steps may be performed by a combination of hardware and software.

The embodiments disclosed herein may be provided as a computer program product or software that may include a machine-readable medium (or a computer-readable medium) having stored thereon instructions, which may be used to program a computer system (or other electronic devices) to perform a process according to the embodiments disclosed herein. A machine-readable medium includes any mechanism for storing or transmitting information in a form readable by a machine (e.g., a computer). For example, a machine-readable medium includes a machine-readable storage medium (e.g., ROM, random access memory ("RAM"), a magnetic disk storage medium, an optical storage medium, flash memory devices, etc.), and the like.

Unless specifically stated otherwise and as apparent from the previous discussion, it is appreciated that throughout the description, discussions utilizing terms such as "processing," "computing," "determining," "displaying," or the like refer to the action and processes of a computer system, or similar electronic computing device, that manipulates and transforms data and memories represented as physical (electronic) quantities within the computer system's registers into other data similarly represented as physical quantities within the computer system memories or registers or other such information storage, transmission, or display devices.

The algorithms and displays presented herein are not inherently related to any particular computer or other apparatus. Various systems may be used with programs in accordance with the teachings herein, or it may prove convenient to construct more specialized apparatuses to perform the required method steps. The required structure for a variety of these systems will appear from the description above. In addition, the embodiments described herein are not described with reference to any particular programming language. It will be appreciated that a variety of programming languages may be used to implement the teachings of the embodiments as described herein.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends on the particular application, design choices, and/or design constraints imposed on the overall system. Skilled artisans may implement the described functionality in varying ways for each particular application, but such implementation decisions should not be interpreted as causing a departure from the scope of the present embodiments.

The various illustrative logical blocks, modules, and circuits described in connection with the embodiments disclosed herein may be implemented or performed with a processor, a Digital Signal Processor (DSP), an Application Specific Integrated Circuit (ASIC), a Field Programmable Gate Array (FPGA), or other programmable logic device, a discrete gate or transistor logic, discrete hardware components, or any combination thereof designed to perform the functions described herein. Furthermore, a controller may be a processor. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The embodiments disclosed herein may be embodied in hardware and in instructions that are stored in hardware and may reside, for example, in RAM, flash memory, ROM, Electrically Programmable ROM (EPROM), Electrically Erasable Programmable ROM (EEPROM), registers, a hard disk, a removable disk, a CD-ROM, or any other form of computer-readable medium known in the art. An exemplary storage medium is coupled to the processor such that the processor can read information from and write information to the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. Those of skill in the art will also understand that information and signals may be represented using any of a variety of technologies and techniques. For example, data, instructions, commands, information, signals, bits, symbols, and chips that may be referenced throughout the above description may be represented by voltages, currents, electromagnetic waves, magnetic fields, optical fields, particles, or any combination thereof.

Unless otherwise expressly stated, it is in no way intended that any method set forth herein be construed as requiring that its steps be performed in a specific order. Accordingly, where a method claim does not actually recite an order to be followed by its steps, or it is not otherwise specifically stated in the claims or descriptions that the steps are to be limited to a specific order, it is in no way intended that any particular order be inferred.

It will be apparent to those skilled in the art that various modifications and variations can be made without departing from the spirit or scope of the invention. Since modifications, combinations, sub-combinations, and variations of the disclosed embodiments incorporating the spirit and substance of the invention may occur to persons skilled in the art, the invention should be construed to include everything within the scope of the appended claims and their equivalents.

What is claimed is:

1. A weighted summing phase interpolator, PI, comprising:

a first PI circuit configured to generate a first interpolated clock having a first interpolated phase in response to a first interpolation code;

a second PI circuit configured to generate a second interpolated clock having a second interpolated phase in response to a second interpolation code; and a weighted summing circuit configured to: employ a weight signal to generate a third interpolated clock having a third interpolated phase, based on the weight signal, between the first interpolated phase and the second interpolated phase, wherein the weighted summing circuit further comprises a weight calibration circuit, the weight calibration circuit configured to:

determine a first time period between an early phase of the third interpolated clock based on a minimum interpolation code and a late phase of the third interpolated clock based on a maximum interpolation code;

determine a second time period between the early phase and a test phase of the third interpolated clock in response to a middle interpolation code in a first test period of a first reference clock;

determine a third time period between the early phase and the test phase of the third interpolated clock in response to the middle interpolation code in a second test period of the first reference clock; and increment the weight signal in response to determining a sum of the second time period and the third time period is greater than the first time period.

2. The weighted summing PI of claim 1, wherein the weight signal comprises a first digital signal corresponding to the first interpolated clock and a second digital signal different from the first digital signal, corresponding to the second interpolated clock.

3. The weighted summing PI of claim 2, wherein:
the third interpolated clock is generated by:
a first plurality of circuits in response to the first interpolated clock; and
a second plurality of circuits in response to the second interpolated clock;
the first plurality of circuits is indicated by the first digital signal; and
the second plurality of circuits is indicated by the second digital signal.

4. The weighted summing PI of claim 2, wherein the second digital signal is a digital inverse of the first digital signal.

5. The weighted summing PI of claim 2, wherein:
the third interpolated clock is generated on an output node;
the third interpolated phase corresponds to a timing of a voltage transition on the output node; and
the timing of the voltage transition depends on the weight signal.

6. The weighted summing PI of claim 5, further configured to generate the third interpolated clock at the third interpolated phase in a phase range between the early phase of the third interpolated clock based on the minimum interpolation code and the late phase of the third interpolated clock based on the maximum interpolation code, wherein a range of interpolation codes from the minimum interpolation code to the maximum interpolation code comprises the first interpolation code.

7. The weighted summing PI of claim 2, wherein:
the weight signal comprises a digital signal; and
the weighted summing circuit comprises a first circuit and a second circuit corresponding to each bit of the weight signal, wherein:
in response to a bit of the weight signal having a first state:
the first circuit corresponding to the bit is configured to couple an output node to a supply voltage source in response to the first interpolated clock in a second state; and
the second circuit corresponding to the bit is configured to couple the output node to a reference voltage source in response to the second interpolated clock in the first state; and in response to the bit of the weight signal having the second state:
the first circuit corresponding to the bit is configured to couple the output node to the reference voltage source in response to the first interpolated clock in the first state; and
the second circuit corresponding to the bit is configured to couple the output node to the supply voltage source in response to the second interpolated clock in the second state.

8. The weighted summing PI of claim 6, wherein the weight calibration circuit is further configured to determine a balanced weight signal comprising the weight signal at which the third interpolated clock is generated at a middle phase in the phase range between the early phase and the late phase in response to the middle interpolation code between the minimum interpolation code and the maximum interpolation code.

9. The weighted summing PI of claim 8, wherein:
the balanced weight signal is one of a plurality of weight signals in a weight signal range;
the third interpolated clock comprises a fifth phase in response to the middle interpolation code and a next higher weight signal than the balanced weight signal in the weight signal range;
the third interpolated clock comprises a sixth phase in response to the middle interpolation code and a next lower weight signal than the balanced weight signal in the weight signal range; and
the middle phase in the phase range is closer to the middle phase between the early phase and the late phase than the fifth phase and the sixth phase.

10. The weighted summing PI of claim 8, wherein the first digital signal of the middle interpolation code comprises equal numbers of bits having "0"s and "1"s.

11. The weighted summing PI of claim 1, wherein the weight calibration circuit comprises:
a first capacitor employed to determine the second time period and the third time period; and
a second capacitor employed to determine the first time period.

12. A method in a weighted summing phase interpolator (PI) circuit, the method comprising:
generating, in a first PI circuit, a first interpolated clock having a first interpolated phase in response to a first interpolation code;
generating, in a second PI circuit, a second interpolated clock having a second interpolated phase in response to a second interpolation code;
generating, in a weighted summing circuit and based on a weight signal, a third interpolated clock at a third interpolated phase between the first interpolated phase and the second interpolated phase, wherein the weighted summing circuit further comprises a weight calibration circuit;
determining, in the weight calibration circuit, a first time period between an early phase of the third interpolated clock based on a minimum interpolation code and a late phase of the third interpolated clock based on a maximum interpolation code;
determining, in the weight calibration circuit, a second time period between the early phase and a test phase of the third interpolated clock in response to a middle interpolation code in a first test period of a first reference clock;
determining, in the weight calibration circuit, a third time period between the early phase and the test phase of the third interpolated clock in response to the middle interpolation code in a second test period of the first reference clock; and
incrementing, by the weight calibration circuit, the weight signal in response to determining a sum of the second time period and the third time period is greater than the first time period.

13. An integrated circuit (IC) comprising:
a sequential logic circuit configured to store data in response to a system clock;
a capture circuit configured to, in each cycle of the system clock, receive the data from the sequential logic circuit in response to a third interpolated clock; and a weighted summing phase interpolator (PI), comprising:

a first PI circuit configured to generate a first interpolated clock having a first interpolated phase in response to a first interpolation code;

a second PI circuit configured to generate a second interpolated clock having a second interpolated phase in response to a second interpolation code;

a weighted summing circuit configured to employ a weight signal to generate the third interpolated clock at a third interpolated phase, based on the weight signal, between the first interpolated phase and the second interpolated phase, wherein the weighted summing circuit further comprises a weight calibration circuit, the weight calibration circuit configured to:

determine a first time period between an early phase of the third interpolated clock based on a minimum interpolation code and a late phase of the third interpolated clock based on a maximum interpolation code;

determine a second time period between the early phase and a test phase of the third interpolated clock in response to a middle interpolation code in a first test period of a first reference clock;

determine a third time period between the early phase and the test phase of the third interpolated clock in response to the middle interpolation code in a second test period of the first reference clock; and increment the weight signal in response to determining a sum of the second time period and the third time period is greater than the first time period.

14. The IC of claim 13, wherein the weight signal comprises a first digital signal corresponding to the first interpolated clock and a second digital signal corresponding to the second interpolated clock.

15. The IC of claim 14, wherein:

the third interpolated clock is generated on an output node;

the third interpolated phase corresponds to a timing of a voltage transition on the output node; and the timing of the voltage transition depends on the weight signal.

16. The IC of claim 15, further configured to generate the third interpolated clock at the third interpolated phase in an interpolated phase range between a third phase of the third interpolated clock based on the minimum interpolation code and a fourth phase of the third interpolated clock based on the maximum interpolation code, wherein a range of interpolation codes from the minimum interpolation code to the maximum interpolation code comprises the first interpolation code.

17. The IC of claim 16, wherein the weight calibration circuit is further configured to determine a balanced weight signal comprising the weight signal at which the third interpolated clock is generated at a middle phase in a phase range, between the third phase and the fourth phase, in response to the middle interpolation code between the minimum interpolation code and the maximum interpolation code.

* * * * *